(12) United States Patent
Colby et al.

(10) Patent No.: US 6,622,271 B1
(45) Date of Patent: Sep. 16, 2003

(54) METHOD AND APPARATUS FOR OPERATING A SYSTEM TO TEST INTEGRATED CIRCUITS

(75) Inventors: David D. Colby, Windom, TX (US); Sowrirajan Balajee, Karnataka (IN); Barton Gregg Wilder, Carrollton, TX (US); Ansell W. Outlaw, Richardson, TX (US)

(73) Assignee: Texas Instruments Incorporated, Dalls, TX (US)

( * ) Notice: Subject to any disclaimer, the term of this patent is extended or adjusted under 35 U.S.C. 154(b) by 350 days.

(21) Appl. No.: 09/652,888

(22) Filed: Aug. 31, 2000

Related U.S. Application Data
(60) Provisional application No. 60/152,470, filed on Sep. 3, 1999.

(51) Int. Cl.[7] .............................................. G01R 31/28
(52) U.S. Cl. ................................................... 714/724
(58) Field of Search .................. 714/718, 35; 365/201; 702/122

(56) References Cited

U.S. PATENT DOCUMENTS 5,828,985 A * 10/1998 Sauer et al. ................ 702/122
6,453,435 B1 * 9/2002 Limon, Jr. et al. .......... 714/724

* cited by examiner

Primary Examiner—Albert Decady
Assistant Examiner—Shelly A Chase
(74) Attorney, Agent, or Firm—Michael K. Skrehot; Wade James Brady, III; Frederick J. Telecky, Jr.

(57) ABSTRACT

A testing system for testing an integrated circuit device includes a test definition generator program which generates an initial test definition from information that includes test data. A checker program checks the initial test definition for compatibility with each of at least two different testers. Each of the testers includes a hardware interface, native software having driver routines for the associated hardware interface, and a compiler compatible with the driver routines. Each tester includes a converter program which has been compiled by a compiler other than the native compiler, and which converts the initial test definition into a modified test definition. The modified test definition is interpreted by an interpreter program, which has been compiled by the native compiler, and which controls the hardware interface through the native driver routines so as to carry out the test definition.

13 Claims, 5 Drawing Sheets instOpArr

| | | | |
|---|---|---|---|
| 321 { | 1 | Op<br>LeftPtr<br>LeftMode<br>RightPtr<br>RightMode<br>num<br>lineNo<br>spmNo | op_assign ← 341<br>ptr to A ← 342<br>valMode ← 343<br>ptr to B ← 346<br>valMode ← 347<br>0 ← 348<br>source line ← 351<br>source file ← 352 |
| 322 { | 2 | Op<br>LeftPtr<br>LeftMode<br>RightPtr<br>RightMode<br>num<br>lineNo<br>spmNo | op_IfNot<br>ptr to expr (A>C) (1) ← 356<br>opMode<br>0<br>noMode<br>5<br>source line<br>source file |
| 323 { | 3 | Op<br>LeftPtr<br>LeftMode<br>RightPtr<br>RightMode<br>num<br>lineNo<br>spmNo | op_assign<br>ptr to C<br>valMode<br>ptr to expr (5*D) (2) ← 357<br>opMode<br>0<br>source line<br>source file |
| 324 { | 4 | Op<br>LeftPtr<br>LeftMode<br>RightPtr<br>RightMode<br>num<br>lineNo<br>spmNo | op_goto<br>0<br>noMode<br>0<br>noMode<br>6<br>source line<br>source file |
| 325 { | 5 | Op<br>LeftPtr<br>LeftMode<br>RightPtr<br>RightMode<br>num<br>lineNo<br>spmNo | op_assign<br>ptr to C<br>valMode<br>ptr to Sin func call (3) ← 358<br>ExtfuncMode<br>0<br>source line<br>source file |
| 326 { | 6 | Op<br>LeftPtr<br>LeftMode<br>RightPtr<br>RightMode<br>num<br>lineNo<br>spmNo | op_exit<br>0<br>noMode<br>0<br>noMode<br>0<br>source line<br>source file |

*FIG. 4*

METHOD AND APPARATUS FOR OPERATING A SYSTEM TO TEST INTEGRATED CIRCUITS

This application claims priority under 35 USC § 119(e)(1) of provisional application numbers 60/152,470 filed Sep. 3, 1999.

TECHNICAL FIELD OF THE INVENTION

This invention relates in general to techniques for testing electrical devices such as integrated circuits and, more particularly, to a method and apparatus for utilizing a single test definition in a tester independent language with multiple different test systems.

BACKGROUND OF THE INVENTION

With respect to electrical devices such as integrated circuits, the manufacturer needs to be able to test the circuits before they are shipped. A variety of testers suitable for testing these circuits are commercially available. In fact, the integrated circuit manufacturer may already own several testers, which are different from each other, but which are each capable of testing the circuits in question. It is frequently desirable to have the freedom to be able to test a given type of integrated circuit on any one of these testers, but there are some problems involved in trying to do this efficiently and inexpensively.

One such problem is that each tester may have a significantly different operator interface. Consequently, in order for a given operator to be able to test a particular device using any tester, each operator must be trained on how to use each tester. The time and expense involved in separate training for each tester can be significant, especially where there are several different types of testers. A further problem is that the various testers each need the test definition for a given device to be expressed in a format proprietary to that particular tester. As a result, implementing the necessary test definition for a given circuit on each of several different testers may involve a substantial amount of work for each tester. Further, where operators need to be able to test a given device on any of several testers, the operators may have to be trained on each of several different test definitions for that device, which involves substantial time and effort.

One known approach for addressing this situation is to discard in its entirety the proprietary software delivered with each tester, and then replace it with new custom software, such that a single common test definition written in a tester independent language will be recognized by the custom software prepared for each of the testers. This simplifies matters in terms of preparing the test definition itself, because only a single test definition needs to be prepared in the tester independent language. However, preparing the necessary custom software for each tester can be prohibitively complex and expensive. This is due in part to the fact that, in writing the new software for each tester, it is complex and expensive to generate the portion of the new software which will interface reliably and accurately with all of the hardware interface circuitry that is an integral part of each tester, and which is different on each tester. Thus, in a sense, this alternative approach simply replaces one set of problems with another set of problems.

A further consideration is that a given integrated circuit may be capable of use in different products, and there may be a need to test the integrated circuit differently, depending on the particular product in which it will ultimately be used. In this regard, the circuit may be made from circuit building blocks known as cells, and there may be a set of default test parameters for a given cell, but in the case of a particular circuit which uses that cell it may be desirable to substitute a different set of test parameters for the default set when generating the portion of the test definition which relates to that cell. It is therefore desirable to have a way to automatically determine which test parameters are to be used in developing a particular test definition. Yet another consideration is that some of the test parameters may be changed after they have been used to generate a particular test definition, but a known tester will not take the update into account unless the entire test definition is regenerated or manually modified.

SUMMARY OF THE INVENTION

From the foregoing, it may be appreciated that a need has arisen for a method and apparatus for testing circuits on any of multiple testers which are different but which each recognize a common test definition, without developing entirely new software for each tester on a custom basis.

According to the present invention, in order to address this need, a method and apparatus are provided for operating a test system that includes a hardware interface adapted to be releasably coupled to a predetermined device under test, and that includes a processor which is operatively coupled to the hardware interface. More particularly, this method and apparatus involve: preparing a test definition which defines a test procedure for the predetermined device; executing on the processor a test application program which is customized for the test system and which includes a software interface for facilitating communication between the processor and the hardware interface; compiling an interpreter program using a compiler which is customized to complement the test application program and which is capable of generating code that is executable by the processor and that interacts directly with the test application program; and executing on the processor the interpreter program, the interpreter program being operative to interpret the test definition and being operative in response to the test definition to control the hardware interface through the test application program.

BRIEF DESCRIPTION OF THE DRAWINGS

A better understanding of the present invention will be realized from the detailed description which follows, taken in conjunction with the accompanying drawings, in which:

FIGS. 4-5 are diagrammatic view of various arrays of information which are part of a modified test definition prepared from an initial test definition by the system of FIG. 1.

DETAILED DESCRIPTION OF THE INVENTION

Figure 1A:
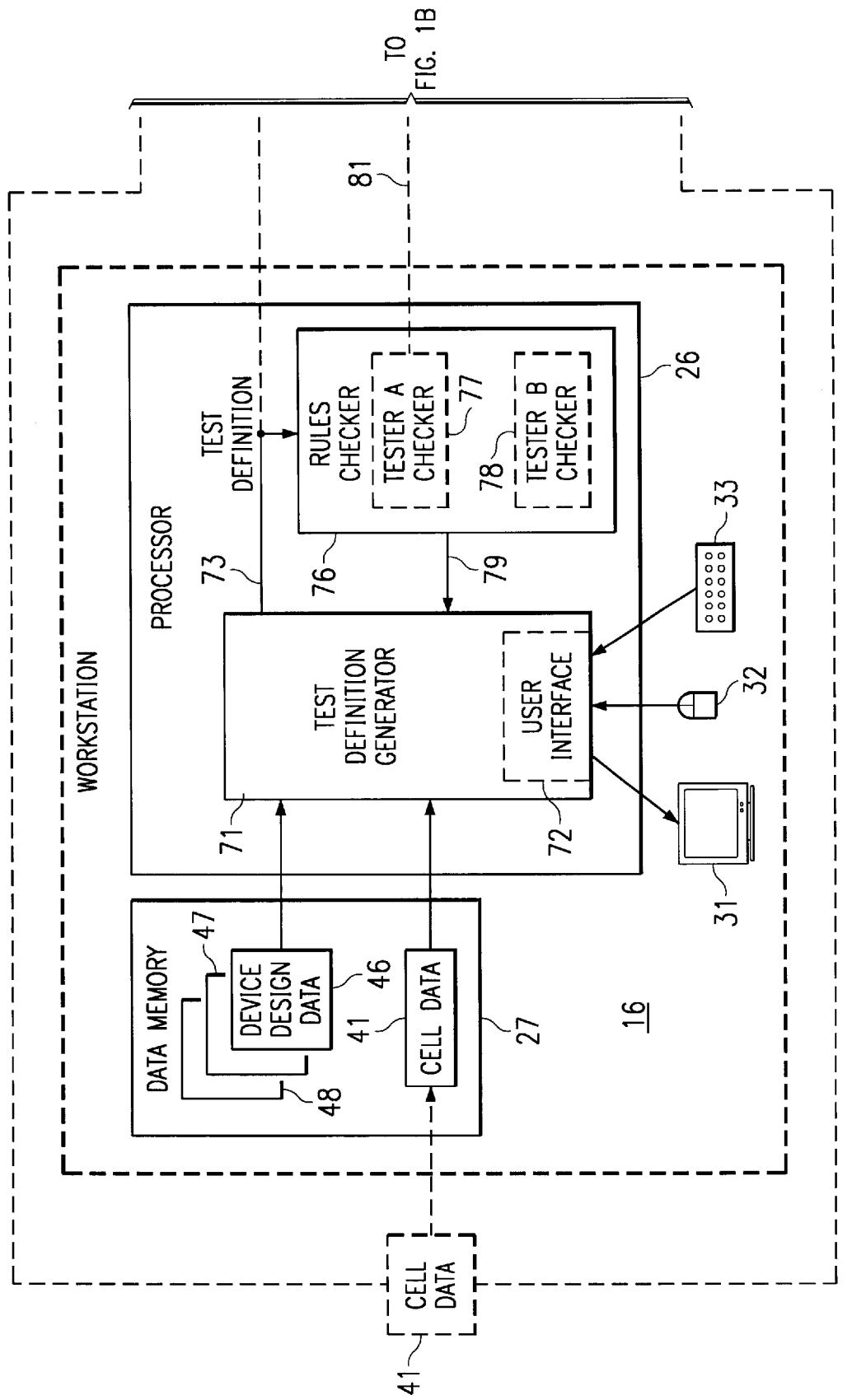
FIG. 1 is a block diagram of a testing system which includes multiple testers and which embodies the present invention.
Figure 1B:
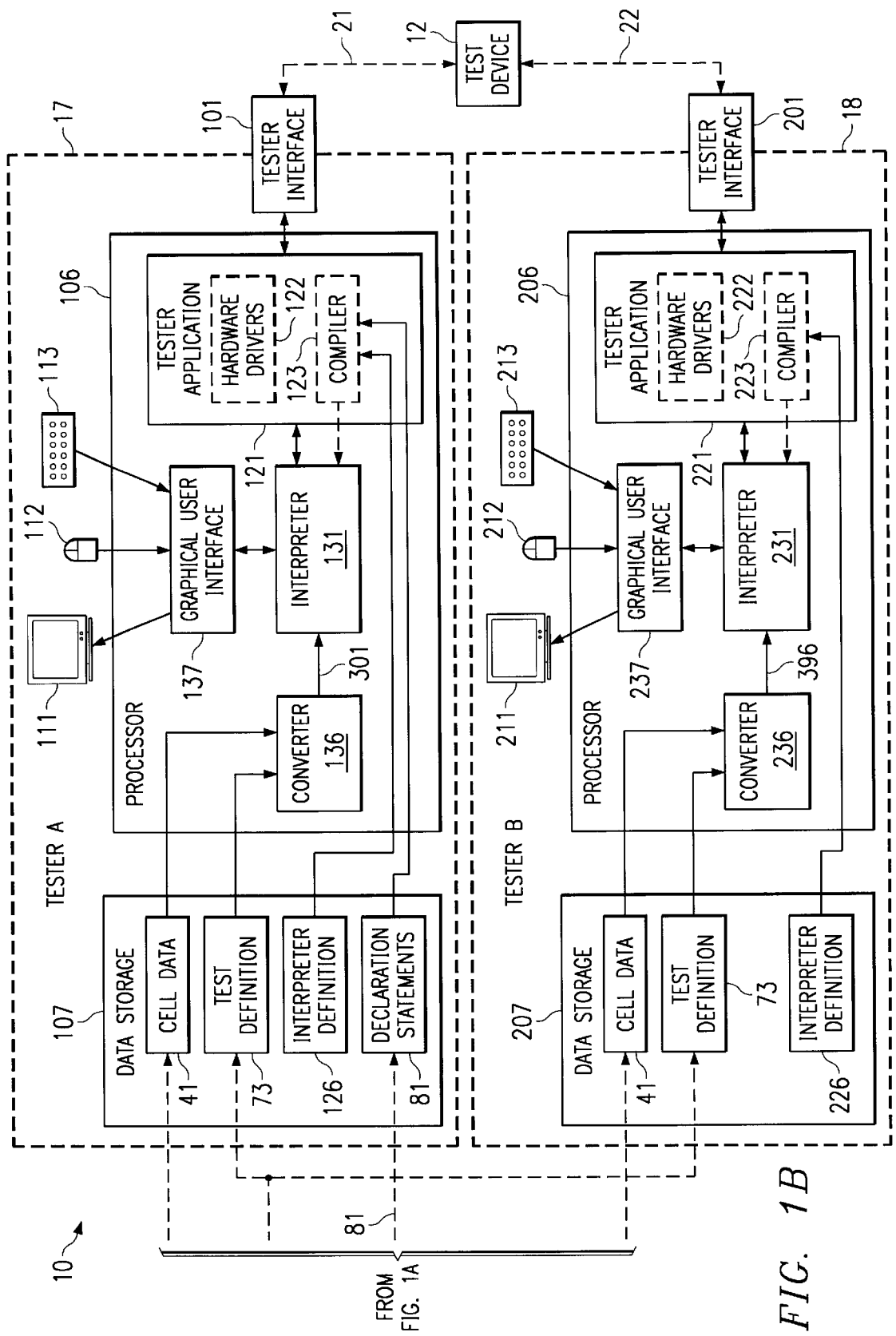

FIG. 1 is a block diagram of a testing system 10 which embodies the present invention. The testing system 10 is provided in order to test one or more types of devices, one of which is represented diagrammatically at 12 in FIG. 1. In the disclosed embodiment, the test device 12 is an integrated circuit device, with circuitry therein which is a combination of a plurality of pre-defined circuit cells. The circuit cells are designed to serve as standardized building blocks, each circuit cell having a configuration which is suitable for use in a variety of different integrated circuits. The circuit cells and the device 12 are known in the art, and are therefore not described in further detail here.

The testing system 10 includes a workstation 16, a first tester 17, and a second tester 18. The testers 17 and 18 are different, as will be described in more detail later. However, each is capable of being coupled to and testing the device 12, as indicated diagrammatically by broken lines at 21 and 22. Although the testers 17 and 18 are different, a feature of the present invention is the capability to generate a test definition in a tester independent language (TIL), which can then be used to cause either of the testers 17 or 18 to properly test the device 12, notwithstanding the fact that the testers 17 and 18 are different from each other. This common test definition is generated using the workstation 16.

More specifically, the workstation 16 in the disclosed embodiment uses computer hardware of a known type, for example a commercially available computer of the type commonly known as a personal computer, and in particular a high performance personal computer of the type commonly known as a workstation. For example, the hardware of the workstation 16 may be implemented using a workstation of the type which is commercially available under the tradename SPARCSTATION from Sun Microsystems, Inc. of Palo Alto, Calif. In the disclosed embodiment, the hardware of the workstation 16 includes a processor 26, a data memory 27, a cathode ray tube (CRT) display 31, a pointing device 32 such as a mouse, and a standard keyboard 33.

Although the workstation 16 shown in FIG. 1 is a hardware platform which is physically separate from the hardware platforms of the testers 17 and 18, it would alternatively be possible for either of the testers 17 and 18, in addition to serving as a tester, to also serve as the platform for the functions which are carried out on the workstation 16. In the disclosed embodiment, however, and for purposes of clarity in describing the present invention, the workstation 16 in FIG. 1 is a physically separate platform.

As mentioned above, the test device 12 is made up of building blocks known as circuit cells. Definitions of a variety of different circuit cells, including each of the circuit cells used in the test device 12, are cumulatively known as cell data, the totality of which is represented diagrammatically at 41 in FIG. 1. A duplicate of the cell data 41 is stored in the data memory 27 of the workstation 16. The cell data 41 includes, for each cell, information about how to test that cell. The cell data 41 is normally updated from time to time.

As discussed above, the circuit cells are building blocks, and the device 12 is a combination of a plurality of different circuit cells. Information about the cells which are in the device 12, and information about how to test the device, is known as device design data. In this regard, the device 12 may be capable of use in various different types of products, and different testing may be desirable for the device 12, depending on the particular product in which it will later be used. For example, depending on the particular product, there may be different temperature ranges across which the device 12 needs to be tested, different supply voltage ranges, different clock speeds, or the like. Consequently, in the disclosed embodiment, the data memory 27 stores three different sets of device design data, which are respectively designated with reference numerals 46–48. Of course, some test devices do not require multiple sets of device design data. However, in order to facilitate an accurate understanding of the present invention, it is assumed that the test device 12 shown in FIG. 1 is a device of the type which does have multiple sets 46–48 of device design data associated with it.

As mentioned above, the cell data 41 includes information about how to test each particular type of cell. However, each of the sets 46–48 of device design data may include alternative information about how to test a particular type of cell when it is in a particular type of device. Consequently, a technique is provided for deciding which test information for a particular type of cell should be used to test that type of cell in a given type of device, or in other words what test criteria for the cell is given precedence over other test criteria. The manner in which this is handled will now be described with reference to FIG. 2.

Figure 2:
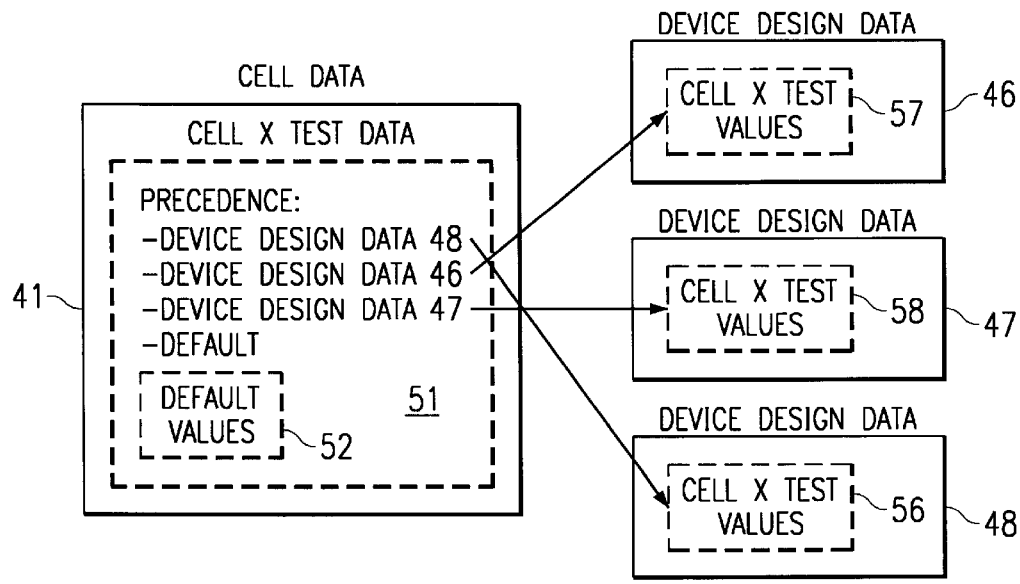
FIG. 2 is a block diagram of certain data which is used to generate test definitions in the system of FIG. 1.

More specifically, FIG. 2 is a diagrammatic view of the cell data 41 and the three sets 46–48 of device design data. The cell data 41 includes test data 51 for a particular type of cell which will be referred to here as cell X. The test data 51 for cell X includes default values 52 for testing this type of cell. However, the test data 51 also includes a precedence definition, which identifies in sequential order how test values in the sets 46–48 of device design data should be given precedence over each other and over the default test values 52.

More specifically, in the example shown in FIG. 2, the precedence definition indicates that the system should first look to see whether the device design data 48 includes test values 56 for cell X. If so, then these test values are used for testing cell X, and all other test values are ignored. On the other hand, if the device design data 48 is not present, or if it is present but does not include test values 56 for cell X, then the precedence definition indicates that the system should next look to the device design data 47, to see if it includes test values 58 for cell X. If so, then these test values are used. Otherwise, the system next looks to device design data 46, to see if it is present and includes test values 57 for cell X. If so, then these test values are used. Otherwise, the precedence definition indicates that the default values 52 should be used.

Referring again to FIG. 1, the processor 26 of the workstation 16 executes a test definition generator program 71, which includes a user interface portion 72 that interacts with the display 31, the pointing device 32 and the keyboard 33. The test definition generator program 71 is responsive to the cell data 41 and the device design data 46–48 in the memory 27, as well as user input, and generates a test definition 73 expressed in a tester independent language (TIL). Various tester independent languages are known in the art, and details of a particular language and the expression of the test definition 73 in that particular language are therefore not described here in detail.

The processor 26 also executes a tester rules checker program 76, which includes portions 77 and 78 that each correspond to a respective one of the testers 17 and 18. The rules checker program 76 evaluates the test definition 73 generated by the test definition generator 71, in order to verify that the test definition 73 is compatible with the capabilities of each of the testers on which it is to be used, including the testers 17 and 18. In more detail, the rules checker program 76 includes a portion 77 which corresponds specifically to the tester 17, and which verifies that the test definition 73 is compatible with the capabilities of tester 17. Similarly, the rules checker program 76 includes a portion 78, which corresponds specifically to the tester 18, and which verifies that the test definition 73 is compatible with the capabilities of the tester 18. If the rules checker program 76 detects a problem, it provides a message at 79 to the test definition generator 71, so that a warning message can be presented to the operator. The operator may then take action which will modify the test definition 73 in a manner that eliminates the problem.

The portion 77 of the rules checker program 76, which corresponds to the tester 17, also evaluates the test definition 73 in order to determine the amount of memory which will be required within the tester 17 in order to carry out the test definition 73. The portion 77 then produces at 81 some declaration statements, which reflect the amount of memory that will be required, and which will be discussed in more detail later.

Turning in more detail to the tester 17, the tester 17 includes a hardware tester interface 101 which can be operatively coupled to the test device 12, as indicated diagrammatically by broken line 21. In the disclosed embodiment, the tester interface 101 includes a connector or socket which effects a mechanical and electrical coupling between the tester interface 101 and the test device 12. The tester interface 101 also includes circuitry of a known type which is capable of effecting an electrical interface with the test device 12, and with other types of test devices. The circuitry of the interface 101 may include components such as signal drivers and receivers.

In the disclosed embodiment, the remaining hardware of the tester 17 is a commercially available workstation, for example a workstation of the type which is discussed above and which is commercially available under the tradename SPARCSTATION from Sun Microsystems, Inc., of Palo Alto, Calif. This workstation has a processor 106, a memory which includes data storage 107, a CRT display 111, a pointing device 112 such as a mouse, and a standard keyboard 113.

All of the hardware of tester 17, including the workstation and the tester interface 101, is a commercially available configuration. This commercially available hardware is delivered with a tester application program 121, which is supplied by the manufacturer and executed by the processor 106. The test application program 121 includes a group of hardware drivers 122, which are software routines written specifically to serve as an interface with the circuitry present in the tester interface 101. In addition, the tester application program 121 includes a compiler 123, which is capable of compiling source code defining a desired test into executable object code which can interface directly with the hardware drivers 122.

The test application program 121 also includes a not-illustrated user interface portion, which can communicate with the display 111, the pointing device 112 and the keyboard 113. This user interface portion of the program 121 is not specifically illustrated in FIG. 1, because it is not used in the embodiment according to the invention. Although the tester application program 121 is generally adequate for its intended purposes, a problem is that the compiler 123 requires source code in a language which is proprietary to the particular manufacturer (and possibly proprietary to the particular model of tester), rather than source code expressed in a tester independent language which can be used with a variety of different testers made by different manufacturers. In the disclosed embodiment, the particular compiler 123 requires source code which is generally similar to the language commonly known as PASCAL, but which includes proprietary characteristics and extensions that facilitate device testing.

One possible solution to this problem would be to discard the entire tester application program 121 provided by the tester manufacturer, and write completely new software for the tester 17 from scratch. However, a substantial amount of time and effort is required to replace the functionality of certain portions of the tester application program 121, especially the hardware drivers 122. Accordingly, a feature of the present invention is that certain portions of the tester application program 121 are ignored, while other selected portions such as the hardware drivers 122 and the compiler 123 are used, as discussed in more detail later.

The data storage section 107 of tester 17 stores a duplicate of the cell data 41, a duplicate of the test definition 73, and also the declaration statements 81 which are generated by the portion 77 of the rules checker program 76. The data storage section 107 also stores an interpreter definition 126, which is a source code program written in the proprietary source language recognized by the compiler 123.

In the disclosed embodiment, the compiler 123 happens to lack the capability to generate an object code file which is capable of dynamically allocating and deallocating memory when it is executed. Accordingly, the maximum necessary amount of memory for a given test definition 73 must be embedded into the object code file at the time it is generated by the compiler 123. To facilitate this, the compiler 123 is responsive to the declaration statements 81, which are source code statements in the language of compiler 123 that indicate to the compiler how much memory in the tester 17 needs to be allocated in order to carry out the test definition 73. In this regard, the declaration statements 81 from the portion 77 of rules checker program 76 are stored in the data storage 107 under a predetermined file name, and the interpreter definition 126 includes a statement which contains this predetermined file name and which instructs the compiler to compile the contents of the file containing the declaration statements 81 at the same time that it is compiling the interpreter definition 126. Stated differently, the declaration statements 81 are in a file of the type commonly known in the art as an "include" file.

When the compiler 123 compiles the interpreter definition 26 and the declaration statements 81, it generates an interpreter program 131, which is an object code program executed by the processor 106. Since the interpreter program 131 is generated by the compiler 123, it is capable of accurately and reliably interfacing with the hardware drivers 122.

There are two further programs which are executed by the processor 106, namely a converter program 136, and a graphical user interface (GUI) program 137. The converter program 136 could theoretically be implemented as a part of the interpreter program 131, but it has been found that the converter program runs more rapidly when it is compiled by a compiler other than the compiler 123. Accordingly, in the disclosed embodiment, the converter program 136 is an object code program generated by a different not-illustrated compiler, from source code different from that recognized by the compiler 123. In the disclosed embodiment, the source code for the converter program 136 is written in a pre-existing language commonly known as "PERL", but it could alternatively be written in various other languages, including the assembly language for the processor 106.

The graphical user interface program 137 is an object code program generated by yet another not-illustrated compiler, which recognizes source code different from that recognized by compiler 123. In the disclosed embodiment, the source code for the user interface program 137 is written in a pre-existing source language commonly known as JAVA. However, the source code for the user interface program 137 could be written in a variety of other languages, including the assembly language for the processor 106. As mentioned above, the tester application program 121 includes a user interface routine which is not illustrated, but which provides an interface between the user and the tester application program 121. In contrast, the user interface program 137 provides an interface between the user and the interpreter 131. The converter program 136 and interpreter program 131 will be discussed in more detail later.

Turning to the tester 18, there a number of hardware and software similarities to the tester 17, and similar reference numerals have therefore been used to identify elements of the tester 18 which correspond directly to elements of the tester 17. The following discussion of tester 18 will focus primarily on some significant differences between the testers 17 and 18.

In more detail, the tester 18 has a hardware tester interface 201 which is functionally comparable to the tester interface 101, but in the disclosed embodiment the specific circuitry provided in interface 201 is somewhat different from the specific circuitry provided in interface 101. Consequently, there may be differences in the test capabilities of testers 17 and 18. For example, tester 18 may be capable of testing the device 12 at higher clock speeds than the tester 17. As to hardware of the tester 18 other than the tester interface 201, it may be a workstation of the same type used in the tester 17, or a different workstation. In the disclosed embodiment, it has a processor 206, a memory with a data storage section 207, a display 211, a pointing device 212, and a keyboard 213.

The tester 18 is delivered with a manufactures tester application program 221, which includes hardware drivers 222 and a compiler 223. The tester application program 221 differs from the tester application program 121 in several respects. For example, in the disclosed embodiment, the hardware drivers 222 differ from the hardware drivers 122, because the circuitry of tester interface 201 differs from the circuitry of tester interface 101. The most significant difference is that the proprietary compiler 223 recognizes a source language which differs radically from the source language recognized by compiler 123. In the disclosed embodiment, the compiler 223 recognizes source code which is based on the language commonly known "C", whereas the compiler 123 recognizes a PASCAL-like source language, as discussed above.

Thus, the interpreter definition 226 stored at 227 is source code in a language radically different from the source code of the interpreter definition 126. The C-based compiler 223 generates object code which is capable of dynamically allocating and deallocating memory during execution. Accordingly, compiler 223 does not need information regarding the amount of memory which will be needed by test definition 73, and thus the data storage section 207 of tester 18 does not store information comparable to the declaration statements 81 that are stored in data storage 107 for the compiler 123 of tester 17. The compiler 223 compiles the interpreter definition 226 in order to generate the interpreter program 231. The interpreter programs 131 and 231 are thus different from each other, in part because they have each been generated by a different compiler 123 or 223. On the other hand, they are similar to the extent that they have each been generated by the respective native compiler of a respective proprietary tester application program 121 or 221 for a respective tester 17 or 18, and thus can accurately and reliably interface directly with the native hardware drivers 122 or 222 of that particular tester.

As to the graphical user interface program 237 of tester 18, the object code will be different from that of the interface program 137 of tester 17. However, in the disclosed embodiment, the interface programs 137 and 237 each provide substantially identical user interfaces to an operator. In other words, an operator using either of the testers 17 and 18 sees, on each display 111 or 211, similar or identical screens which present similar or identical options, and the operator selects among those options using a keyboard or mouse in a similar manner. Consequently, not only can the test definition 73 be directly used in either of the testers 17 and 18, but an operator who is trained to use one of the testers 17 and 18 can easily use the other tester with little or no additional training, because the interface programs 137 and 237 interact in substantially the same manner with an operator. The particular details of the user interface are not significant here, but the interface should appear the same to an operator on each of the testers 17 and 18.

In general, during operation of either tester 17 or 18, the test definition 73 is used by the converter program 136 or 137 and by the interpreter program 131 or 231 to effect testing of the test device 12 through the hardware drivers 122 or 222 and the tester interface 101 or 201. As mentioned above, the converter programs 136 and 236 could each be an integral part of the associated interpreter 131 or 231. However, as also mentioned above, it has been found that the function implemented by the converter programs 136 and 236 can be completed more rapidly if these programs are separately written and compiled in a selected language such as PERL, rather than being written and compiled in the source language of the associated native compiler 123 or 223.

Focusing now in more detail on the converter program 136 of the tester 17, the converter program 136 converts the initial test definition 73 into a modified test definition 301. In order to facilitate a clear understanding of the present invention, one specific example of a portion of the initial test definition 73, and how the converter program 136 handles its conversion, will now be explained in association with FIGS. 3–5. In this regard, assume that part of the initial test definition 73 is the following routine, which is expressed here in a tester independent language:

```
A = B;
If (A > C) {
C = 5*D;
}
Else {
C = Sin(C);
}
```

Figure 3:
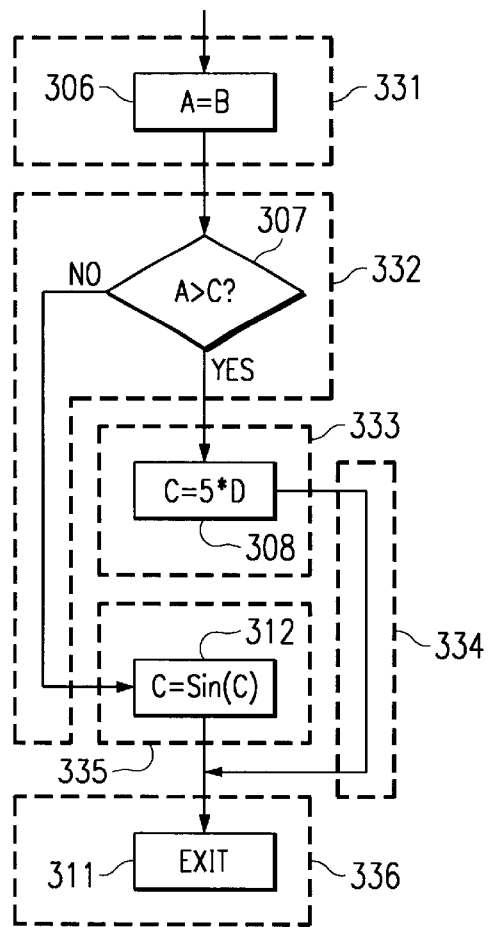
FIG. 3 is a flowchart of a portion of an exemplary test routine which might be part of a test definition used in the testing system of FIG. 1.

The specific syntax of the particular tester independent language used for the foregoing statements is not part of the present invention, and is therefore not described here in detail. A simple way to clearly show the operations which are embodied in the foregoing statements, without explaining the syntax in detail, is through use of a flowchart. FIG. 3 is a flowchart for the foregoing statements.

More specifically, with reference to FIG. 3, block 306 represents an assignment operation, where the current value of variable A is discarded and replaced with the current value of variable B. Then, in block 307, this new value of variable A is compared to the value of variable C. If the value of variable A is greater than that of variable C, then control proceeds to block 308, where the value of variable D is multiplied by 5, and the resulting product is stored in variable C. Control then proceeds from block 308 to block 311, where an exit is made from the routine. On the other hand, if it was determined at block 307 that the value of variable A was less than or equal to the value of variable C, then control would have proceeded to block 312. In block 312, a calculation is made of the trigonometric sine function for the value in variable C, and the result of the calculation is then stored as the new value of variable C. Control then proceeds from block 312 to block 311, which is the exit from the routine.

Figure 5:
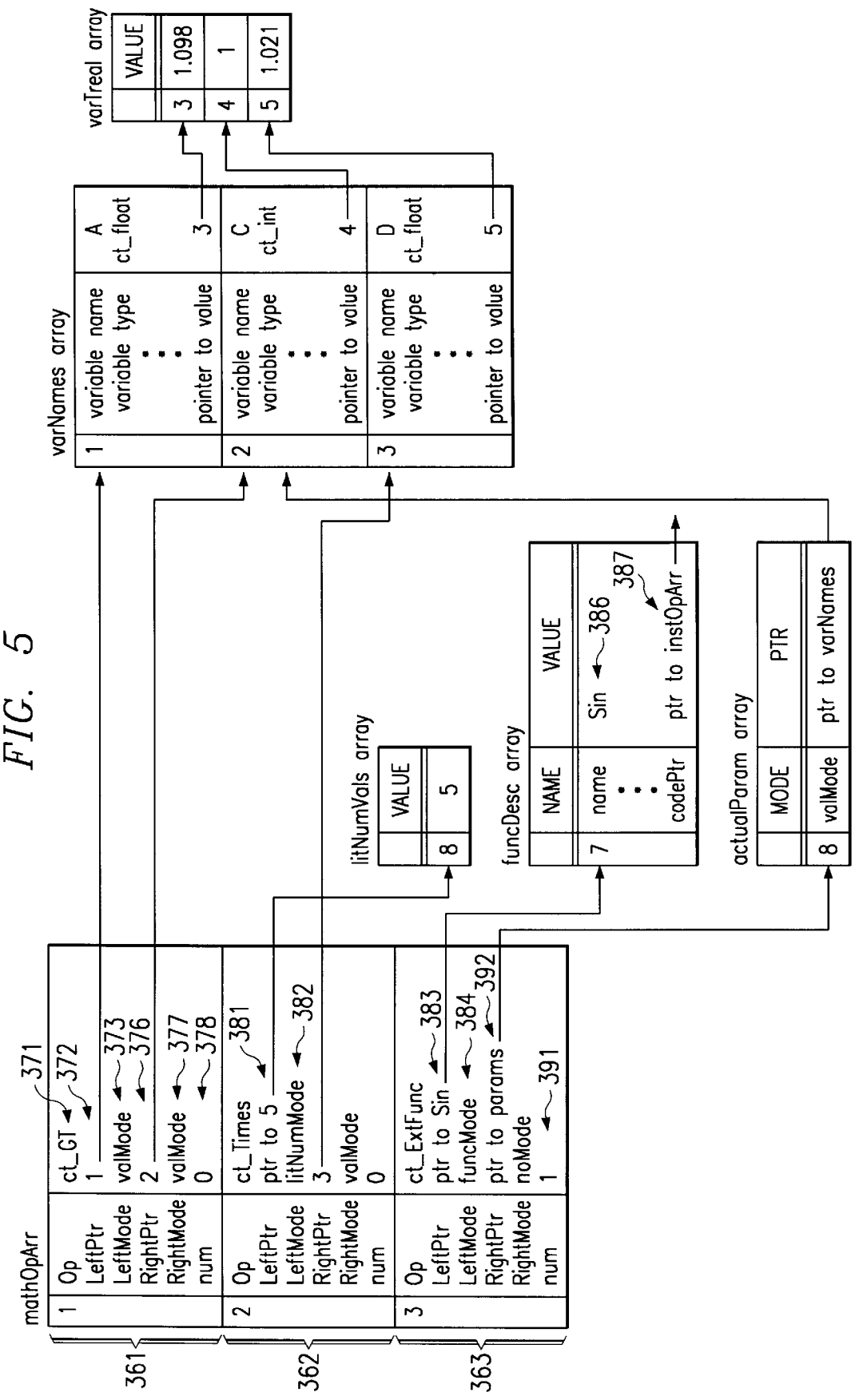

The converter program 136 (FIG. 1) converts the information shown in FIG. 3 into tables or arrays, examples of which are shown in FIGS. 4 and 5. More specifically, FIG. 4 shows a portion of an array named instOpArr. FIG. 4 shows six elements 321–326 of this array which respectively correspond to the portions of FIG. 3 designated by respective broken lines at 331–336. Each of the array elements 321–326 has the same basic format, which will be described in association with the specific element 321.

More specifically, the first entry 341 in element 321 is an operation code. In the case of element 321, which corresponds to block 306 in FIG. 3, the specific operation in question is an assignment, and this is indicated by the pneumonic "op_assign". The next entry 342 is a pointer, which in element 321 is a pointer to the left operand "A" of the expression in block 306. The next entry 343 is a mode pointer, which indicates what type of information the pointer at 342 is pointing to, as discussed in more detail later. The next two entries 346 and 347 are similar to the entries 342 and 343, except that they correspond to the right operand "B" of the expression in block 306.

The entry 348 in element 321 identifies the next element of the instOpArr array which is to be processed. For example, if the value of entry 348 is zero, as shown for element 321, then the next sequential element of the array is processed. In other words, after processing of element 321 is completed, element 322 will be processed. On the other hand, if the entry 348 is any other positive integer, then the next element processed may not be the next sequential element, but some other element of the array (as identified by the numbers which appear in the left column of the array). For example, in element 324, the next element is identified as "6", and the left column of the array contains a "6" for element 326. Consequently, element 326 will be processed after processing of element 324 is completed. In some elements, this will involve a conditional determination. For example, in element 322, the next element is identified as "5", but the operation code "op_IfNot" is a conditional determination that corresponds to the decision block 307 in FIG. 3. If the condition is true, then the next element processed is element 325, whereas if the condition is not true, then the next element processed is the next sequential element, namely element 323.

The next entry 351 in element 321 identifies the line number in the test definition 73 which contains the expression shown in block 306. This information is included in the array in order to facilitate implementation of debugging features, such as the common debugging feature known as breakpoints. The last entry 352 in the element 321 is an indication of the source file which contains the expression that appears in block 306. For example, the test definition 73 may happen to be stored in more than one file, and entry 352 would identify one of those files by name.

Turning to element 322, entry 356 is an example of a pointer to an element which is in a different array, and which will effect evaluation of the expression "If (A>C)", or in other words the determination of whether A is greater than C. This will be described in more detail later. Similarly, entry 357 in element 323 and entry 358 in element 325 are each pointers to the further array. This further array is the mathoPArr array, which is shown at the left side of FIG. 5. Entries 356–358 in the instOppArr array of FIG. 4 respectively point to elements 361–363 in the mathOpArr array of FIG. 5.

In FIG. 5, each of the elements 361–363 of the mathOPArr array includes six entries, which will be described in association with the element 361. The first entry 371 is an operation code "ct_GT" where the letters "GT" stand for "greater than" to indicate the particular operation which is involved in the expression of interest. The next two entries 372–373 are a pointer and mode indicator which are directly equivalent to the pointer and mode indicators 342–343 discussed above with respect to FIG. 4. The next two entries 376–377 are also a pointer and mode indicator. The final entry 378 in element 361 is a number, which is zero in element 361 because it is not needed in that particular element. An example of its usefulness will be discussed later, in association with element 363.

In element 361, the mode entry 373 is "valMode", which is an indication that the entry 372 is a pointer or index to a varNames array, which is shown near the right side of FIG. 5. The varNames array in FIG. 5 includes three elements, which respectively correspond to the variables A, C and D. The first entry in each element of this array is the variable name, and the next entry indicates the variable type, for example whether it is an integer variable or a floating point variable. The final entry in each element is a pointer or index to a varTreal array, which is shown at the right side of FIG. 5 and which contains the actual current value of each variable.

Referring now to the second element 362 of the mathOpArr array, entries 381 and 382 are a pointer and mode indicator corresponding to a literal or constant value of 5. In particular, the mode indicator 382 is "litNumMode", which indicates that the pointer 381 is a pointer or index into a litNumVals array which is shown in FIG. 5, and which includes an element containing the actual constant value of 5.

Turning now to element 363 of the mathOpArr array, which relates to the calculation of the trigonometric sine function, entries 383 and 384 are a pointer and mode indicator relating to the trigonometric sine function. In particular, the mode indicator is "funcMode", which is an indication that the pointer 383 is a pointer or index into a funcDesc array shown in FIG. 5, the illustrated element of which corresponds to the trigonometric sine function. This element includes a "name" entry 386, which indicates that the element corresponds to the "Sin" function. Further, this element includes an entry 387 that points to a not-illustrated element of the instOpArr array of FIG. 4, which is the first of several elements in that array which effect the calculation of the trigonometric sine function.

Most functions are passed at least one parameter which they need to carry out the function in question. The trigonometric sine function requires one parameter, which is the value for which it determines the corresponding trigonometric sine. In array element 363, the last entry 391 is the value "1", to indicate that one parameter is passed to the trigonometric sine function. A further entry 392 in the array 363 is a pointer to the parameter for the trigonometric sine function. In particular, it is a pointer or index to an actualParam array shown in FIG. 5, and identifies an element thereof which includes a pointer to the second element of the varNames array. The second element of the varNames array corresponds to the variable C, and in turn includes a pointer to the actual value of variable C, which is stored in the varTreal array.

Thus, FIGS. 4–5 show an exemplary portion of the modified test definition 301 which is produced by the converter program 136 of FIG. 1. In response to this modified test definition 301, the interpreter program 131 controls the hardware drivers 122 and thus the test interface 101 in a manner which carries out the specified testing of the test device 12. The converter program 236 in the tester 18 carries out a similar conversion of the initial test definition 73, in order to produce a modified test definition 396 which is supplied to the interpreter program 231. The modified test definition 396 may be structured in a manner similar to that shown in FIGS. 4–5, or may be structured somewhat differently. For example, the compilers 123 and 223 may tend to use different data formats to store information in memory. Consequently, the modified test definitions 301 and 396 may each be structured to utilize respective different data storage formats which each correspond to those utilized by a respective compiler 123 or 223. Regardless of the particular data storage format, however, the basic principles are essentially the same, and are reflected by the foregoing discussion of FIGS. 4 and 5.

The converter programs 136 and 236 each perform an additional function. In particular, as they are converting the initial test definition 73 into the respective modified test definitions 301 and 396, the converter programs 136 and 236 check the test definition 73 for information which has its origin in the cell data 41, and compare this information to the corresponding information in the current copy of the cell data 41 which is stored at 107 or 207. If this portion of the cell data 41 has been updated since the test definition 73 was created, then the converter program 136 or 236 will use the updated information from the current cell data 41, substituting it for the obsolete information which was included in the test definition 73 at the time the test definition was created. On the other hand, if the test definition 73 includes certain information drawn from the device design data 46–48, then the converter programs 136 and 236 will not make any update to corresponding portions of the test definition, even if there has been an update to the corresponding default information in the cell data 41.

The testing system 10 of FIG. 1 operates as follows. In advance of any testing, an operator at the workstation 16 uses the test definition generator 71 to generate a test definition 73 for the device 12, based on information from the device design data 46–48 and/or the cell data 41. The resulting test definition 73 is checked by the rules checker program 76, in order to be certain that it is compatible with the capabilities of both the tester 17 and the tester 18. If a problem is detected, then a warning message is provided to the operator, so that appropriate adjustments can be made to the test definition 73. After any appropriate adjustments are made, the resulting test definition 73 is stored in each of the testers 17 and 18, in particular at 107 and 207, respectively.

In addition, the portion 77 of the rules checker program 76 determines the amount of memory which will be required in tester 17 in order to carry out the test definition 73, and prepares declaration statements 81, which are instructions to the compiler 123 to provide that amount of memory. The declaration statements 81 are stored in the tester 17 at 107, using a predetermined file name. Thereafter, before testing any of the devices 12 using the tester 17, an operator executes the compiler 123. The compiler 123 uses the interpreter definition 126 and the declaration statements 81 to generate the interpreter program 131, which is customized for the device 12.

In order to actually carry out tests on the test device 12 using tester 17, the operator couples the device 12 to the tester interface 101. Then, the operator initiates the actual test, which is carried out in two stages. In the first stage, the converter program 136 takes the initial test definition 73, and converts it into a modified test definition, for example a modified test definition of the type described above in association with FIGS. 4 and 5. During this first stage, the converter program 136 also checks the test definition for information derived from cell data that has been subsequently updated, and makes corresponding updates in the modified test definition. Then, in the second stage, the interpreter program 131 uses the modified test definition to actually carry out tests on the test device 12, by interacting with the hardware driver routines 122 in a manner that effects control of the circuitry in test interface 101 so as to effect the desired testing of the device 12.

If any errors are detected, the interpreter program 131 will provide the operator with an identification of those errors. The operator has the capability to carry out certain debug functions of a standard type, such as setting breakpoints, dynamically changing the values of variables, and so forth. Further, the operator can instruct the interpreter program 131 to maker changes to the modified test definition 301, for example to correct errors which were present in the initial test definition 73, or to implement special test conditions to help identify an elusive problem in a particular device 12.

Turning to the tester 18, the tester 18 is operated in substantially the same manner as the tester 17, but with some minor differences. In this regard, and as mentioned above, the compiler 223 can generate an interpreter 231 which can handle dynamic memory allocation. Accordingly, the interpreter 231 can be compiled prior to generation of the initial test definition 73 and the modified test definition 396, and can be used with a number of different test definitions corresponding to various different types of test devices 12. On the other hand, and as mentioned above, a significant similarity between the testers 17 and 18 is that the interface programs 137 and 237 each provide virtually the same user interface to an operator. Thus, an operator trained on one of the testers 17 and 18 could operate the other thereof with little or no additional training.

The present invention provides a number of technical advantages. One such technical advantage is the capability to use two or more different testers with a single common test definition, without generating all software for the testers in the form of entirely new software developed completely from scratch. Al further advantage is the capability to automatically detect incompatibilities between a test definition and any of the various target testers with which it will be used. Still another advantage results from the capability to automatically update certain information embedded in the test definition when running the test in a situation where the original source of that information has been updated subsequent to generation of the test definition. Still another advantage is the provision of operator interfaces on each of two different testers which appear to the operators to be substantially identical, so that an operator trained to use one of the testers can operate the other tester with little or no additional training.

A further advantage relates to the efficiency achieved by providing a converter program which is generated by a compiler other than a native compiler of the tester, and which modifies the initial test definition into a modified test definition, and by providing an interpreter program which is compiled by the native compiler of the tester and which uses the modified test definition to carry out testing. Another advantage is the provision of capability for the interpreter program to appropriately handle memory allocation where the native compiler of a tester cannot produce object code which does dynamic memory allocation.

Although one embodiment has been illustrated and described in detail, it should be understood that various substitutions and alterations can be made thereto without departing from the scope of the invention. For example, the disclosed embodiment involves generation of a test definition which can be used with either of two different testers, but it will be recognized that the number of testers is not limited to two, and the principles of the present invention allow a single test definition to be used on many different testers. Another example is that, while the disclosed embodiment uses converter and interpreter programs that are each compiled by a different type of compiler, it is possible for the interpreter and converter programs to be respective portions of a single program compiled by the same native compiler. A further example is that the disclosed embodiment relates to a test device which is an integrated circuit, but the principles of the present invention could also be applied to other types of devices, such as circuits made from discrete components. Other substitutions and alterations are also possible without departing from the spirit and scope of the present invention, as defined by the following claims.

What is claimed is:

1. An apparatus, comprising:
   an initial test definition which defines a test procedure for a predetermined device that is to be tested;
   a converter which converts said initial test definition into a modified test definition; and
   a test system which includes:
      a hardware interface adapted to be releasably coupled to the predetermined device;
      a processor which is operatively coupled to said hardware interface;
      a test application program customized for said test system and executed by said processor, said test application program including a software interface for facilitating communication between said processor and said hardware interface;
      a compiler customized to complement said test application program and capable of generating code that is executable by said processor and that interacts directly with said test application program; and
      an interpreter program compiled by said compiler and executed by said processor, said interpreter program being operative to interpret said modified test definition and being operative in response to said modified test definition to control said hardware interface through said test application program.

2. An apparatus according to claim 1, including a memory coupled to said processor; wherein said compiler lacks the capability to generate code that can dynamically allocate memory; including a program operative to provide information to said compiler identifying an amount of memory which will be required by said processor in association with interpretation by said interpreter program of said modified test definition; and wherein said compiler is responsive to said information regarding said amount of memory for compiling said interpreter program so that said interpreter program will allocate said amount of memory during execution of said interpreter program.

3. An apparatus according to claim 2, wherein said information regarding said amount of memory includes a compiler command which is stored in a predetermined file, and wherein said compiler accesses said predetermined file to determine said amount of memory.

4. An apparatus according to claim 1, wherein said converter includes a converting program compiled by a compiler other than said compiler used to compile said interpreter.

5. An apparatus according to claim 4, wherein said converting program is executed by said processor.

6. An apparatus according to claim 1,
   wherein said initial test definition is based on test data; and
   wherein said converter is operative during said conversion to identify test information which is in said initial test definition and which is derived from said test data, to determine whether a portion of said test data corresponding to said test information has been updated, and to prepare said modified test definition so as to reflect updates to said portion of said test data when said portion has been updated.

7. An apparatus according to claim 1, wherein said compiler includes a compiler program which is executed by said processor.

8. An apparatus, comprising:
   a test definition which is written in a tester independent language and which defines a test procedure for a predetermined device that is to be tested;
   a first test system which includes:
      a first hardware interface adapted to be releasably coupled to the predetermined device;
      a first processor which is operatively coupled to said first hardware interface;
      a first test application program customized for said first test system and executed by said first processor, said first test application program including a software interface for facilitating communication between said first processor and said first hardware interface;
      a first compiler customized to complement said first test application program and capable of generating code that is executable by said first processor and that interacts directly with said first test application program; and
      a first program portion which is operative in response to said test definition to control said first hardware interface through said first test application program, said first program portion including an interpreter program which is compiled by said first compiler, which is executed by said first processor, and which interacts with said first test application program to effect said control of said first hardware interface; and
   a second test system which is different from said first test system and which includes:
      a second hardware interface adapted to be releasably coupled to the predetermined device;
      a second processor which is operatively coupled to said second hardware interface;
      a second test application program customized for said second test system and executed by said second processor, said second test application program including a software interface for facilitating communication between said second processor and said second hardware interface;
      a second compiler customized to complement said second test application program and capable of generating code that is executable by said second processor and that interacts directly with said second test application program; and a second program portion which is operative in response to said test definition to control said second hardware interface through said second test application program, said second program portion including an interpreter program which is compiled by said second compiler, which is executed by said second processor, and which interacts with said second test application program to effect said control of said second hardware interface.

9. An apparatus according to claim 8, wherein said first program portion includes a first converter program which converts said test definition into a first modified definition, said first converter program being compiled by a compiler other than said first compiler, and said first interpreter program being responsive to said first modified definition for effecting control of said first hardware interface; and wherein said second program portion includes a second converter program which converts said test definition into a second modified definition, said second converter program being compiled by a compiler other than said second compiler, and said second interpreter program being responsive to said second modified definition for effecting control of said second hardware interface.

10. An apparatus according to claim 8, including first and second user interface sections, and including first and second user interface programs which are respectively executed by said first and second processors, said first and second user interface programs respectively interacting with said first and second interface sections so as to provide a substantially uniform user interface at each of said first and second user interface sections.

11. An apparatus according to claim 10, including a checker program for evaluating said test definition to determine whether said test definition exceeds a capability of either of said first and second test systems.

12. A method of operating a test system which includes a hardware interface adapted to be releasably coupled to a predetermined device that is to be tested, and a processor which is operatively coupled to said hardware interface, comprising the steps of:

preparing an initial test definition which defines a test procedure for the predetermined device;

converting said initial test definition into a modified test definition;

executing on said processor a test application program which is customized for said test system and which includes a software interface for facilitating communication between said processor and said hardware interface;

compiling an interpreter program using a compiler which is customized to complement said test application program and which is capable of generating code that is executable by said processor and that interacts directly with said test application program; and executing on said processor said interpreter program, said interpreter program being operative to interpret said modified test definition and being operative in response to said modified test definition to control said hardware interface through said test application program.

13. A method according to claim 12, wherein said step of converting includes the step of compiling a source definition of a converter program using a compiler other than said compiler used to compile said interpreter.

* * * * *